United States Patent [19]

Darty

[11] Patent Number: 5,730,607

[45] Date of Patent: Mar. 24, 1998

[54] STACKED PRINTED CIRCUIT BOARD CONNECTOR

[75] Inventor: Mark A. Darty, Madison, Ala.

[73] Assignee: McDonnell Douglas Corp., Huntsville, Ala.

[21] Appl. No.: 589,890

[22] Filed: Jan. 23, 1996

[51] Int. Cl.⁶ ..................... H01R 9/09
[52] U.S. Cl. ..................... 439/74; 439/83
[58] Field of Search ............. 439/78, 83, 74, 439/75

[56] References Cited

U.S. PATENT DOCUMENTS

| | | | |
|---|---|---|---|
| 4,133,592 | 1/1979 | Cobaugh et al. | 439/74 |
| 4,479,686 | 10/1984 | Hoshino et al. | 439/78 |
| 4,533,200 | 8/1985 | Wilson | 439/74 |
| 4,797,113 | 1/1989 | Lambert | 439/74 |
| 4,872,843 | 10/1989 | Anstey | 439/69 |
| 4,923,405 | 5/1990 | Munsterman et al. | 439/78 |
| 4,950,170 | 8/1990 | Miller, Jr. | 439/74 |
| 5,059,130 | 10/1991 | Miller, Jr. | 439/74 |
| 5,169,322 | 12/1992 | Frantz et al. | 439/83 |
| 5,176,526 | 1/1993 | Hillbish et al. | 439/74 |

*Primary Examiner*—Neil Abrams
*Attorney, Agent, or Firm*—Donald E. Stout; Kenton R. Mullins

[57] ABSTRACT

An electrical connector includes a perimeter wall having an upper portion, a lower portion, and an intermediate portion located between the upper portion and the lower portion. An inner surface of the upper portion of the perimeter wall forms a receiving aperture, and an outer surface of the lower portion of the perimeter wall forms a protrusion. Electrical contacts are located on the inner surface of the upper portion of the perimeter wall, and are also located on the outer surface of the lower portion of the perimeter wall. Each electrical contact runs from the outer surface of the lower portion, to the inner surface of the upper portion, and then to a connection point on the printed circuit board. A flange contacts and surrounds the intermediate portion of the perimeter wall. The electrical contacts from the inner surface of the upper portion pass through apertures in the flange before being connected to the connection points on the printed circuit board. These connection points on the printed circuit board may include surface solder mounts or, alternatively, may include pin-in-hole solder mounts. Bolts passing through other apertures in the flange securely mount the electrical connector to the printed circuit board. The upper and lower portions are matable with plugs and receptacles, respectively, mounted on other printed circuit boards. The connectors may also be floatably mounted on the circuit board or alternatively one of the upper or lower portions may be floatably mounted with respect to the other.

35 Claims, 3 Drawing Sheets

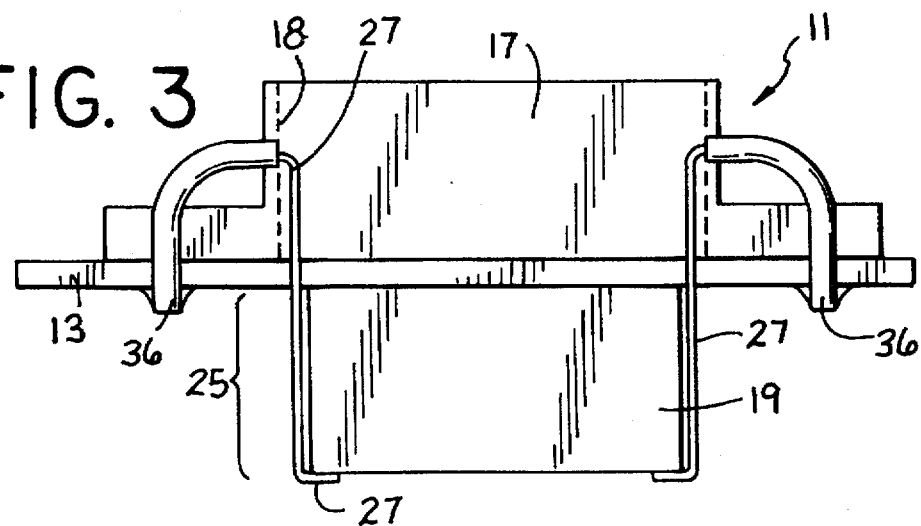
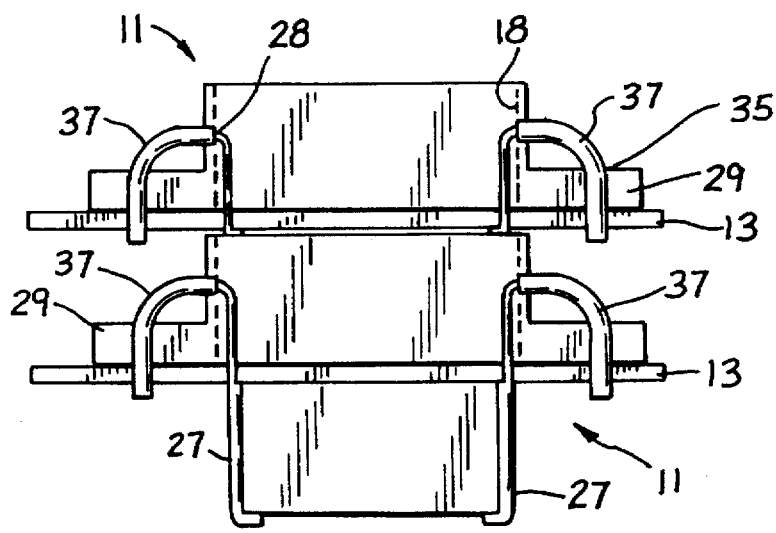
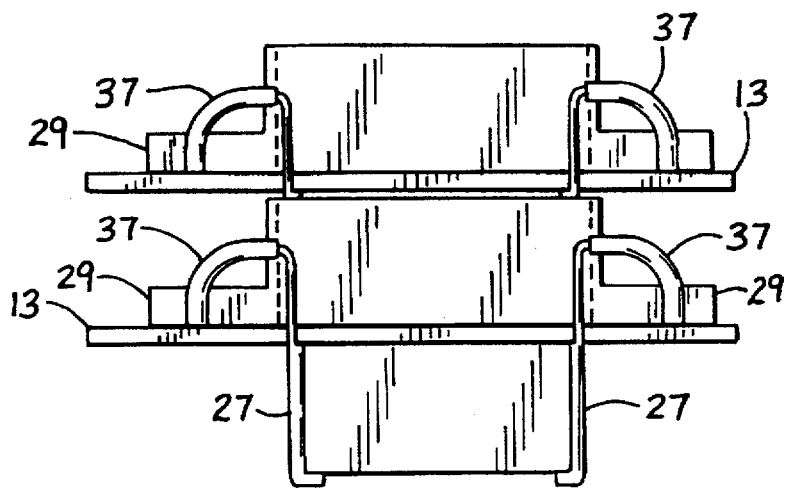

STACKED PRINTED CIRCUIT BOARD CONNECTOR

BACKGROUND OF THE INVENTION

The present invention relates generally to printed circuit board connectors and, more particularly, to a printed circuit board connector which allows printed circuit boards to be stacked or mounted side by side in a card cage.

A communication path must be established between printed circuit boards before communication can be commenced. The prior art has proposed several solutions for connecting printed circuit boards through the years, but the need for compact, reliable, and lightweight components in the computer industry has not altogether been met. These considerations may be of particular importance in the aerospace industry, where volume and weight are primary concerns. Even in the commercial and consumer products industry, volume and weight can translate to increased manufacturing costs.

In many applications where a mother board is not necessarily needed, the use of a mother board to interconnect printed circuit boards is an example of a poor architecture, since the mother board unnecessarily increases the volume, weight, and complexity of the system. As an alternative to the use of a mother board for connecting printed circuit boards, board-to-board connectors may be used. FIG. 1 illustrates the use of four board-to-board connectors 6 for connecting together three printed circuit boards 13. Each board-to-board connector 6 is connected to a printed circuit board 13 via a number of pin-in-hole solder connections 5 to the printed circuit board 13. These pin-in-hole solder connections 5 provide both mechanical and electrical connections of the board-to-board connectors 6 to the printed circuit boards 13. The reliance upon a pin-in-hole solder connection 5 to withstand stresses resulting from movement of the printed circuit boards 13 may be misplaced, especially in aerospace applications. For example, vibration of a printed circuit board 13 may rupture one of the pin-in-hole solder connections 5, thus rendering the electrical connection from that pin-in-hole solder connection 5 unreliable. A need has thus existed in the prior art for a means for mechanically securing the board-to-board connectors 6 to the printed circuit boards 13, to thereby relieve the pin-in-hole solder connection 5 of compromising structural forces.

Another disadvantage associated with the board-to-board connectors 6 shown in FIG. 1 results from the pin-in-hole connections between the board-to-board connectors 6. According to these board-to-board connectors 6, the pins 7 of a top board-to-board connector 6, for example, are inserted into the holes 8 of a bottom board-to-board connector 6, for example. The pins 7 of the top board-to-board connector 6 protrude and are susceptible to being bent and/or broken before insertion into the holes 8 of the bottom board-to-board connector 6. Additionally, since two board-to-board connectors 6 are required to connect two printed circuit boards 13, a relatively large distance between the two printed circuit boards 13 is required. A more advantageous connector would reduce the amount of space required between two adjacent, connected printed circuit boards 13.

Still another problem associated with the board-to-board connectors 6 results from the large number of contact breaks and solder joints required to connect the three printed circuit boards 13 of FIG. 1, for example. In order to pass from a first printed circuit board through the two additional printed circuit boards, a signal must pass through at least four pin-in-hole solder connections 5, and further must pass through at least two pin 7 in hole 8 connections. This high number of contact breaks and solder joints may introduce unreliability and signal distortion into the system. The pin-in-hole solder connections 5 further require each pair of board-to-board connectors 6 to be staggered. Accordingly, the board-to-board connectors 6 cannot be mounted directly in line.

Another prior art apparatus is disclosed in U.S. Pat. No. 5,059,130 to Miller, Jr., which issued on Oct. 22, 1991. As shown in FIG. 1 of this patent, for example, the pins 15 of each single connector 10 penetrate through a printed circuit board and into another connector 10. Since each pin 15 of a first connector 19 is placed through a printed circuit board into another connector 10, the electrical connections of these pins 15 cannot be visually inspected after assembly. Moreover, each pin 15 must be soldered into its corresponding through hole in the printed circuit board. The resulting solder bubble from this soldering step will likely extend from the bottom surface of the printed circuit board, thus preventing a uniformly flat surface for flush mounting of the next connector 10.

Solder from this solder step is also likely to flow out oft he through hole of the printed circuit board and under the first connector 10, which could potentially run across to another pin 15 thereby causing an unwanted electrical connection. Such an unwanted electrical connection, however, could not be visually detectible due to the presence of the first connector housing 10 thereabove. Moreover, since the mechanical strength of the connector 10 is derived from the pins 15, surface mounting of these pins 15 would not be possible. This pin-in-hole mounting is subject to the structurally compromising forces mentioned with reference to the board-to-board connectors 6 shown in FIG. 1 above.

Another patent to Kobaugh et al., U.S. Pat. No. 4,133,592, issued on Jan. 9, 1979, discloses a similar printed circuit board connector. Each of the connectors has a pin 9, which passes through a printed circuit board and into another connector 11. A complicated camming system is used to physically secure each pin 9 into its associated hole in another receiving connector. This prior art apparatus, however, does not address the need in the prior art for visual inspection after assembly of the connector to the printed circuit board. Nor does this device allow for surface mounting of the connector to the printed circuit board.

SUMMARY OF THE INVENTION

The electrical connector of the present invention does not rely on pin-in-hole soldering connections for establishing electrical contact between printed circuit boards. In applications where a rugged connection between two printed circuit boards is desired, the electrical connectors of the present invention maybe secured to the printed circuit boards via bolts, for example. Once the printed circuit boards and the electrical connectors are securely connected, disrupting forces on the electrical contacts are attenuated. This attenuation of disrupting forces on the electrical contacts between the electrical connectors of the present invention and the printed circuit boards allows for surface mounting of these electrical connections.

The electrical connector of the present invention is both compact, simple in design, and easy to manufacture. The housing of the electrical connector, for example, can be molded into a single piece of plastic. Once the electrical connector is electrically connected to the printed circuit board, the resulting electrical connections can be visually inspected to insure a high quality product. X-ray inspection techniques of the prior art are thus unnecessary.

The electrical connector of the present invention includes a perimeter wall having an upper portion, a lower portion, and an intermediate portion located between the upper portion and the lower portion. An inner surface of the upper portion of the perimeter wall forms a receiving aperture, and an outer surface of the lower portion of the perimeter wall forms a protrusion. Electrical contacts are located on the inner surface of the upper portion of the perimeter wall, and are also located on the outer surface of the lower portion of the perimeter wall. Each electrical contact runs from the outer surface of the lower portion, to the inner surface of the upper portion, and then to a connection point on the printed circuit board.

A flange contacts and surrounds the intermediate portion of the perimeter wall. The electrical contacts from the inner surface of the upper portion pass through apertures in the flange before being connected to the connection points on the printed circuit board. These connection points on the printed circuit board may include surface solder mounts or, alternatively, may include apertures in the printed circuit board for accommodating the electrical contacts via pin-in-hole solder mounts. Bolts passing through other apertures in the flange securely mount the electrical connector to the printed circuit board.

The electrical connector of the present invention is thus mounted to a printed circuit board via the flange of the electrical connector. Since this flange is located on an intermediate portion of the perimeter wall, the upper portion of the electrical connector protrudes from a first side of the printed circuit board, and the lower portion of the electrical connector protrudes from a second side of the printed circuit board. The upper portion of the electrical connector includes the receiving aperture and the electrical contacts on the inner surface thereof. Similarly, the lower portion of the electrical connector forms the protrusion, which protrudes from the second side of the printed circuit board. A second electrical connector connected to a second printed circuit board, for example, may be connected to the first electrical connector by placing the protrusion of the second electrical connector into the receiving aperture of the first electrical connector. Similarly, a third printed circuit board may be connected using a third electrical connector, by placing the protrusion of the first electrical connector into the receiving aperture of the third electrical connector.

The electrical contacts disposed on the inner surface of the upper portion and on the outer surface of the lower portion may be flat to thereby increase the surface area of the electrical contact when the protrusion of one electrical connector is inserted into the receiving aperture of another electrical connector. Another means of enhancing the frictional fit between electrical connectors includes the construction of the electrical contacts with a slight curvature. Still another means of increasing the frictional contact between electrical contacts is to manufacture the lower portion of each electrical connector with a slight curvature to thereby generate an increasing amount of friction as the lower portion of the electrical connector is increasingly inserted further and further into an upper portion of another electrical connector.

According to another aspect of the present invention, stress on the connection points where the electrical contacts of the electrical connector are connected to the printed circuit board, may be relieved by securing the electrical connector to the printed circuit board with flexible electrical contacts. The use of flexible electrical contacts to secure the electrical connector to the printed circuit board allows the electrical connector to float with respect to the printed circuit board to thereby attenuate stress on the connection points. According to another feature of the present invention, the lower portion may be manufactured separate from the upper portion, and these two portions may be connected by the electrical contacts. In order to allow the lower portion to float with respect to the upper portion, the electrical contacts may be flexible. The use of flexible electrical contacts may be especially advantageous in military or aerospace applications, where significant impact or vibrational forces are anticipated. Another application for these flexible contacts may be in the computer architecture of a portable computer.

The present invention, together with additional features and advantages thereof, may best be understood by reference to the following description taken in connection with the accompanying illustrative drawings.

BRIEF DESCRIPTION OF THE DRAWINGS

FIG. 3 is a cross-sectional view of the electrical connector of the presently preferred FIG. 4 is a side view of two electrical connectors of the presently preferred embodiment connecting two printed circuit boards;

FIG. 5 is a side view of two electrical connectors of the presently preferred embodiment connecting two printed circuit boards using surface mount technology;

DETAILED DESCRIPTION OF THE PREFERRED EMBODIMENTS

Figure 1:
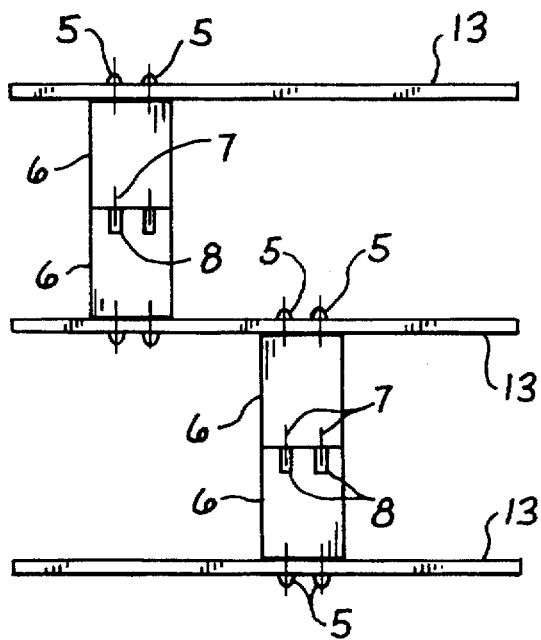
FIG. 1 is a cross-sectional view of four board-to-board connectors of the prior art, used to connect three printed circuit boards.
Figure 2:
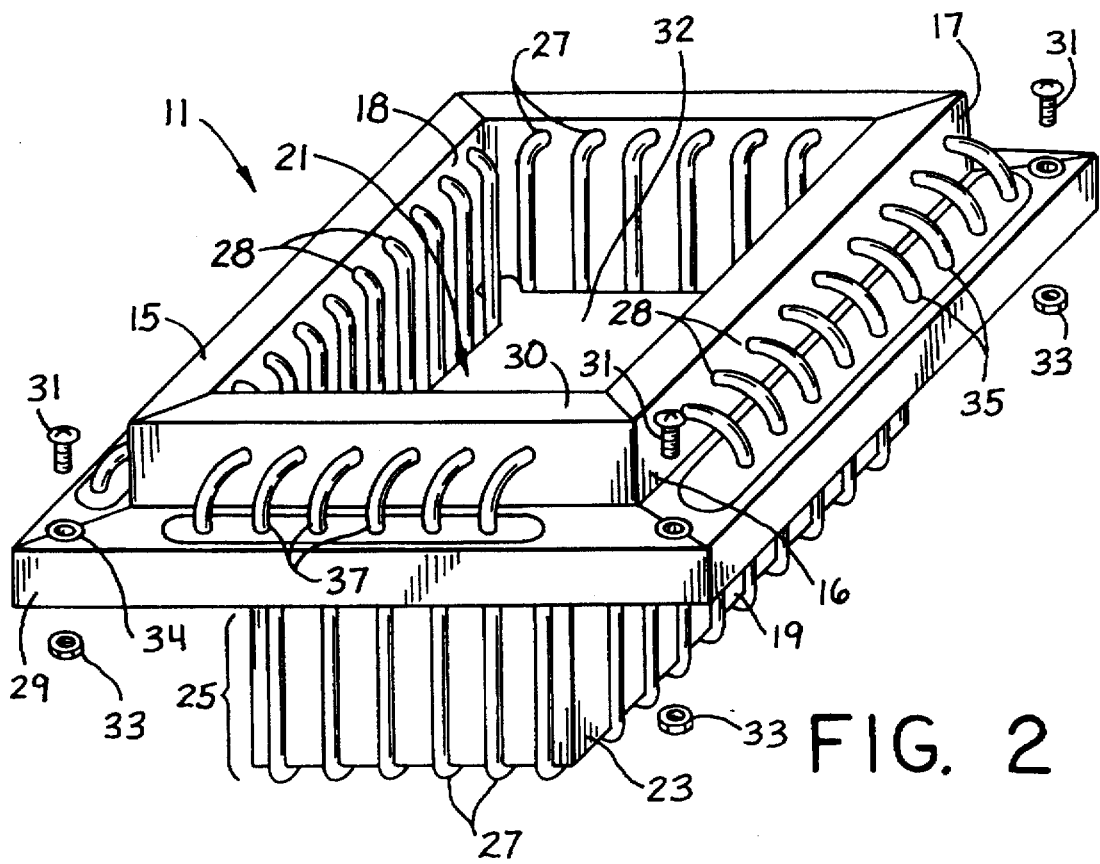
FIG. 2 is a perspective view of the electrical connector of the presently preferred embodiment.

FIG. 2 shows a perspective view of the electrical connector 11 of the presently preferred embodiment. The electrical connector 11 comprises a perimeter wall 15. As presently embodied, the perimeter wall 15 comprises four connected sides to thereby form a rectangle. The perimeter wall 15 may, however, comprise any curvilinear or polygonal formation. Additionally, the four sides of the perimeter wall 15 may have different links. For example, a slim line electrical connector 11 may be configured where two opposing sides of the perimeter wall 15 are much shorter than the other two opposing sides. This configuration would provide a very narrow electrical connector 11 with, for example, electrical contacts only on the two longer opposing sides.

The perimeter wall 15 comprises an upper portion 17 and a lower portion 19. A flange 29 contacts and surrounds the perimeter wall 15 at an intermediate portion between the upper portion 17 and the lower portion 19. The flange 29 may, however, be secured to the upper portion 17 or the lower portion 19. Moreover, the flange 29 may comprise only tabs or protrusions, instead of the presently preferred four-sided, connected embodiment.

The upper portion 17 of the electrical connector 11 comprises an outer surface 16 and an inner surface 18. The inner surface 18 forms a receiving aperture 21, which is sized to accommodate a lower portion 19 of another electrical connector 11.

A lower portion 19 comprises a bottom surface 20 and an outer surface 23. The outer surface 23 of the lower portion 19 comprises a protrusion 25 which is sized to fit within a receiving aperture 21 of another electrical connector 11. As presently embodied, the electrical connector 11 is manufactured by injection molding, for example, into a single unitary piece. This single, unitary piece of the electrical connector 11, which includes the upper portion 17, the lower portion 19, and the flange 29, may comprise plastic, metal, or a ceramic material.

Electrical contacts 27 are secured to the bottom surface 20 of the lower portion 19. These electrical contacts 27 run from the bottom surface 20 up onto the outer surface 23 of the lower portion 19. In the presently preferred embodiment, the same electrical contacts 27 continue up the inner surface 18 of the upper portion 17, but the contacts 27 may be separate. Each of the electrical contacts 27 then passes through a corresponding aperture 28 in the upper portion 17. Although apertures 28 in the upper portion 17 are presently preferred, other means of routing the electrical contacts 27 out of the receiving aperture 21 may be used. For example, the electrical contacts 27 may be routed over the upper rim 30 of the upper portion 17. Electrical connecting means 37 pass from the aperture 28 and into the electrical connecting apertures 35. As presently embodied, these electrical connecting means comprise the electrical contacts 27. The presently preferred means of securing the electrical contacts 27, between the bottom surface 20 of the lower portion 19 and the apertures 28, comprises a shelf 32. The electrical contacts 27 preferably pass through the electrical connector apertures 35 to a bottom surface (not shown) of the flange 29. The bottom surface of the flange 29 contacts a printed circuit board 13 (FIG. 3) when the electrical connector 11 is secured to the printed circuit board 13.

The electrical connector apertures 35 thus serve to secure and align the electrical contacts 27 for connection to the printed circuit board 13 via the underside of the flange 29. In an alternative embodiment, where a strong architecture is not required, the flange 29 may be deleted from the configuration of the electrical connector 11 altogether. In this embodiment, the electrical contacts 27 pass from the apertures 28 directly onto connection points (not shown) on the printed circuit board 13. In regular applications, however, the flange 29 is used, since this flange 29 does not introduce a significant amount of weight to the computer architecture. On the other extreme, where heavy impact and/or vibrational forces are expected, the flange 29 is secured to the printed circuit board 13 using bolts 31. These bolts 31 pass through apertures 34 in the flange 29 and, further, pass through apertures (not shown) in the printed circuit board 13.

Nuts 33 are used in combination with the bolts 31 to firmly secure the flange 29 to the printed circuit board 13. Although nuts 33 and bolts 31 are presently preferred, other connecting means for connecting the flange 29 to the printed circuit board 13 may be used. For example, rivets may be used. An adhesive may also be used to secure the flange 29 to the printed circuit board 13, either in combination with the nuts 33 and bolts 31, or independently thereof. This adhesive may be used, since typically electrical connections do not occur on the printed circuit board 13 beneath the flange 29.

Still another means for securing the flange 29 to the printed circuit board 13 may simply comprise the surface mount solder connection points of the electrical contacts 27 to the printed circuit board 13. According to this embodiment, the electrical contacts 27 protrude slightly from the electrical connector apertures 35 at the bottom surface of the flange 29, and fit onto solder pads located on the printed circuit board 13. The surface mounting of the electrical contacts 27 onto the solder pads of the printed circuit board 13 may be used, for example, as the only means of securing the flange 29 to the printed circuit board 13. According to other embodiments, this surface mounting technique may be used in combination with the bolts 31 and/or the adhesive securing means.

Another means of securing the flange 29 to the printed circuit board 13 may comprise a pin-in-hole technique. As shown in FIG. 3, the bottom ends 36 of the electrical contacts 27 pass through apertures (not shown) in the printed circuit board 13. These bottom ends 36 of the electrical contacts 27 are then solder mounted to the printed circuit board 13 using conventional pin-in-hole solder connections. This pin-in-hole solder connection provides additional strength, compared to only the surface mounting solder connection of the electrical contacts 27 to the printed circuit board 13. As with the surface mounting technique, this pin-in-hole technique may be used in combination with other above-mentioned techniques for securing the flange 29 to the printed circuit board 13.

The strength of the connection of the flange 29 to the printed circuit board 13 may further be enhanced by the use of very strong electrical contacts 27. For example, electrical contacts having a larger diameter may be used in the pin-in-hole solder mounting technique, to possibly alleviate any need for bolts 31 and/or adhesive. According to the present invention, a single, unitary housing of the electrical connector 11 may accommodate several sizes and/or combinations of electrical contacts thereon. As another example, relatively flat electrical contacts 27 may be used for added strength.

FIG. 4 illustrates a side view of the electrical connectors 11 connecting two printed circuit boards 13. The lower portion 19 of the upper electrical connector 11 is shown inserted into the upper portion 17 of the lower electrical connector 11. As the protrusion 25 of the upper electrical connector 11 is inserted into the receiving aperture 21 of the lower electrical connector 11, the electrical contacts 27 of the upper electrical connector 11 brush against the electrical contacts 27 of the lower electrical connector 11. When the electrical contacts 27 are manufactured in a relatively flat configuration, a better electrical contact is established from the brushing-together effect. Additionally, the frictional forces between the electrical contacts 27 of the two electrical connectors 11 serve to align the protrusion 25 of the upper electrical connector 11 within the receiving aperture 21 of the lower electrical connector 11.

In a presently preferred embodiment, the outer surfaces 23 of the protrusion 25 are slightly angled, relative to one another, to thereby generate increasing frictional forces as the lower portion 19 of the upper electrical connector 11 is inserted into the receiving aperture 21 of the lower electrical connector 11. Alternatively, the inner surfaces 18 of the receiving aperture 21 may be slightly angled, relative to one another. Additionally, the electrical contacts 27, within either the receiving aperture 21 or on the protrusion 25, may be slightly bowed or curved to generate frictional forces upon insertion of a protrusion 25 into a receiving aperture 21. As shown in FIGS. 4 and 5, the portion 37 of the electrical contact 27, between the apertures 28 in the upper portion 17 and the electrical connector apertures 35, may be coated with an insulating material, such as plastic, for example.

In another embodiment of the present invention, only selected electrical contacts 27 may extend from the inner surface 18 of the upper portion 17 to the outer surface 23 of the lower portion 19, according to preference. A user may, at the time of the printed circuit board assembly, select the electrical contacts 27 for the desired signal paths that are to be made available to the next printed circuit board in the stack. If a full length contact is chosen, the electrical contact 27 extends from the upper portion 17 of the electrical connectors 11 down to the lower portion 19 of the electrical connector 11. If a short contact is chosen, the electrical contact 27 terminates within the upper portion 17, so that the electrical contact 27 is not available for another printed circuit board receiving aperture 21, which will receive the protrusion 25 without the electrical contact 27. The selection of which electrical contacts 27 are to extend onto the lower portion 19 of a given electrical connector 11 may be made by a user according to a custom manufacturing process, or may be made according to predetermined configurations in a large-scale manufacturing situation.

Figure 6:
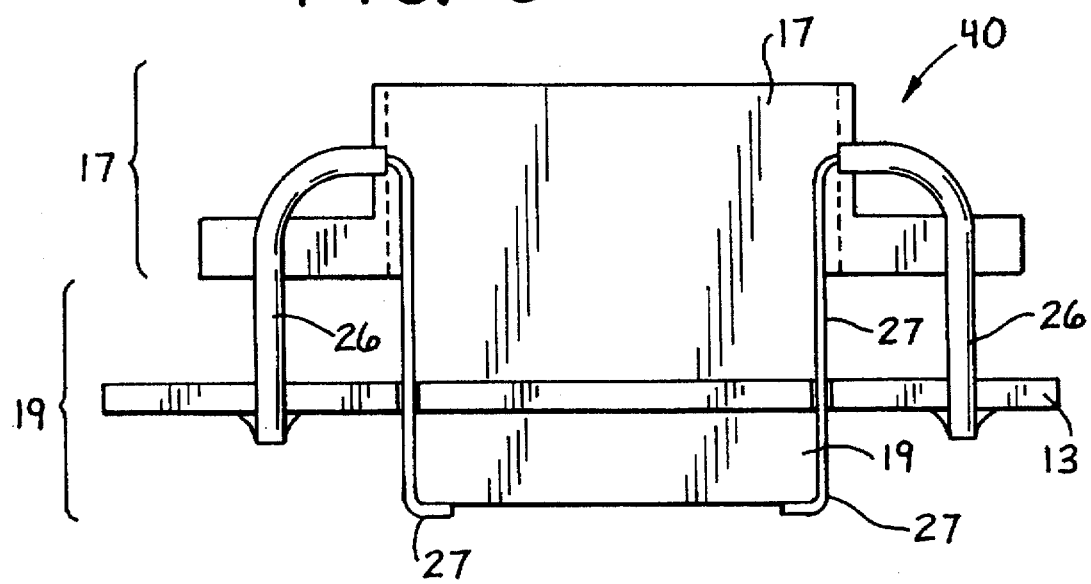
FIG. 6 is a side view of an electrical connector according to a one alternative embodiment of the present invention.

FIG. 6 shows a side view of an electrical connector 40 according to an alternative embodiment. In this embodiment, the lower portion 19 of the electrical connector 40 may fit within the printed circuit board 13 in a somewhat loose fashion. In the presently preferred embodiment, the lower portion 19 fits snugly within an aperture (not shown) of the printed circuit board 13. A flexible conductor 26 electrically and mechanically connects the printed circuit board 13 to the electrical connector 40. The flexible conductor 26 may comprise wire or flex conductor strands, for example. This configuration allows the electrical connector 40 to float with respect to the printed circuit board 13, thus attenuating stressful forces on connection points between the flexible conduit 26 and the printed circuit board 13.

Figure 7:
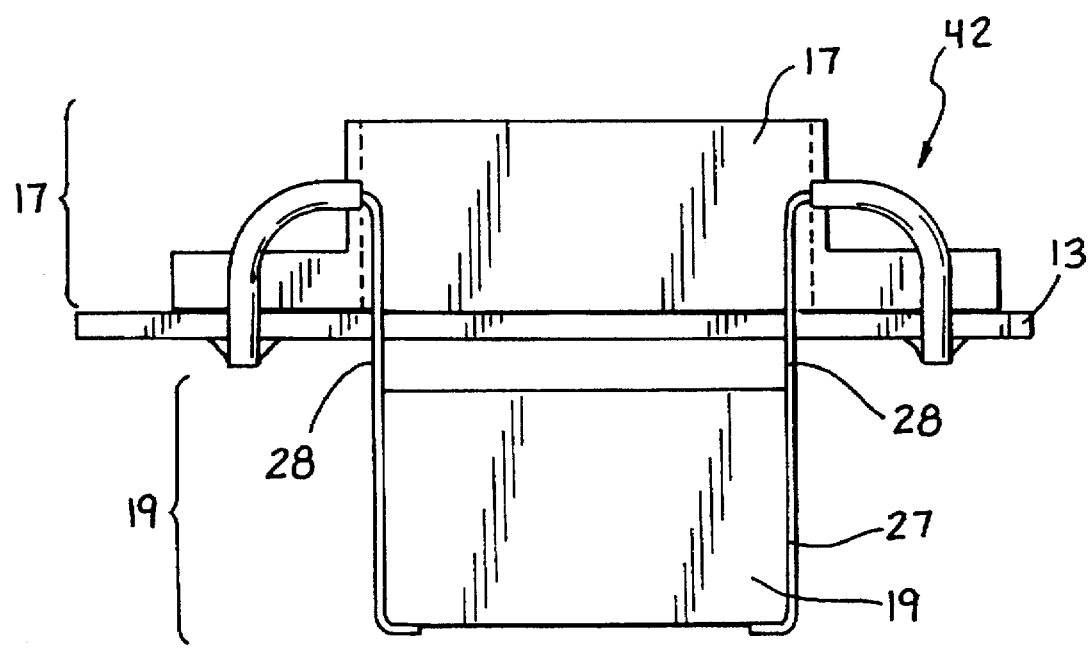
FIG. 7 is a side view of an electrical connector according to another alternative embodiment of the present invention.

Another alternative embodiment is shown in FIG. 7, where the upper portion 17 of the electrical connector 42 and the lower portion 19 of the electrical connector 42 comprise separate pieces. In this embodiment, the electrical contacts 27 comprise flexible conductors 28, which connect the upper portion 17 to the lower portion 19. According to the preferred implementation of this embodiment, the upper portion 17 of the electrical connector 42 is rigidly mounted to the printed circuit board 13, and the lower portion 19 is allowed to float with respect to the printed circuit board 13. The upper portion 17 may be configured to float using the embodiment of FIG. 6, for example, and the lower portion 19 may be rigidly secured to the printed circuit board 13 or may float using the flexible connector 28.

Although exemplary embodiments of the invention have been shown and described, many other changes, modifications and substitutions, in addition to those set forth in the above paragraph, may be made by one having ordinary skill in the art without necessarily departing from the spirit and scope of this invention.

I claim:

1. An electrical connector connectable to a printed circuit board, the electrical connector comprising:
   a perimeter wall having an upper portion, a lower portion, and an intermediate portion located between the upper portion and the lower portion, the upper portion of the perimeter wall having an inner surface that forms a receiving aperture, and the lower portion of the perimeter wall having an outer surface that forms a protrusion;
   a first plurality of electrical contacts located on the inner surface of the upper portion of the perimeter wall, the first plurality of electrical contacts also being located on the outer surface of the lower portion of the perimeter wall;
   a flange contacting and surrounding the intermediate portion of the perimeter wall, the flange defining a first plane which is parallel to a second plane defined by the printed circuit board;
   securing means for securing the flange to the printed circuit board; and
   electrical connecting means for electrically connecting the first plurality of electrical contacts to a second plurality of electrical contacts located on the printed circuit board;
   wherein the receiving aperture is configured to receive a second protrusion of a second similarly-configured electrical connector, and
   wherein the protrusion is configured to fit into a third receiving aperture of a third similarly-configured electrical connector.

2. The electrical connector connectable to a printed circuit board according to claim 1, wherein the electrical connecting means operates as the securing means.

3. The electrical connector connectable to a printed circuit board according to claim 2, wherein the electrical connecting means comprises a plurality of apertures in the flange for accommodating the first plurality of electrical contacts, and
   wherein the first plurality of electrical contacts is fed through the plurality of apertures in the flange and is then electrically connected to the second plurality of electrical contacts.

4. The electrical connector connectable to a printed circuit board according to claim 3, wherein the electrical connecting means further comprises a plurality of apertures in the printed circuit board for accommodating the first plurality of electrical contacts.

5. The electrical connector connectable to a printed circuit board according to claim 3, wherein the securing means comprises mechanical securing means for mechanically securing the flange to the printed circuit board, and
   wherein the first plurality of electrical contacts is surface mounted to the second plurality of electrical contacts.

6. The electrical connector connectable to a printed circuit board according to claim 5, wherein the mechanical securing means comprises a plurality of apertures in both the flange and the printed circuit board, for accommodating a corresponding plurality of connectors, each connector fitting through both an aperture in the flange and an aperture in the printed circuit board.

7. The electrical connector connectable to a printed circuit board according to claim 5, wherein the mechanical securing means comprises four apertures in the flange, each of the four apertures accommodating a corresponding bolt.

8. An electrical connector for connecting a first printed circuit board to both a second printed circuit board and a third printed circuit board, the second and third printed circuit boards having corresponding second and third electrical connectors connected thereto, the electrical connector comprising:
   (a) a perimeter wall comprising:
      (1) an inner surface forming a receiving aperture near an upper portion of the perimeter wall, the receiving aperture being configured to receive a second protrusion of the second electrical connector; and
      (2) an outer surface forming a protrusion near a lower portion of the perimeter wall, the protrusion being configured to fit into a third receiving aperture of the third electrical connector; and
   (b) electrical connecting means disposed on the inner surface of the receiving aperture and on the outer surface of the protrusion, the electrical connecting means being electrically connected to the first printed circuit board at connection points of the first printed circuit board, the disposition of the electrical connecting means on the outer surface of the protrusion providing for visual inspection by a user of the electrical connecting means; and (c) a flange, connected to the perimeter wall, for securing the electrical connector to the first printed circuit board.

9. The electrical connector according to claim 8, wherein the visual inspection, provided by the disposition of the electrical connecting means on the outer surface of the protrusion, allows the user to visually determine a configuration of the electrical connecting means.

10. The electrical connector according to claim 9, wherein the electrical connecting means comprises a plurality of parallel conductors, each of the plurality of parallel conductors running from the connection points of the printed circuit board to the inner surface of the receiving aperture.

11. The electrical connector according to claim 10, wherein a selected number of the plurality of parallel conductors further runs from the inner surface of the receiving aperture to the outer surface of the protrusion, to thereby provide selected electrical connections between the electrical connector and the third electrical connector.

12. The electrical connector according to claim 11, wherein a user can visually inspect whether each of the plurality of parallel conductors runs from the inner surface of the receiving aperture to the outer surface of the protrusion.

13. The electrical connector according to claim 12, further comprising a first plurality of apertures located in the flange for accommodating the plurality of parallel conductors, the plurality of parallel conductors connecting to the plurality of connection points and allowing for visual inspection thereof after connection of the electrical connector to the first printed circuit board.

14. The electrical connector according to claim 13, wherein both the flange and the perimeter wall are rectangular.

15. The electrical connector according to claim 14, wherein the electrical connecting means is disposed on only two opposing sides of the rectangular perimeter wall.

16. The electrical connector according to claim 14, wherein the electrical connecting means is disposed on all four sides of the rectangular perimeter wall.

17. The electrical connector according to claim 13, further comprising a second plurality of apertures located in both the flange and the printed circuit board, the second plurality of apertures in the flange and printed circuit board accommodating a corresponding plurality of bolts to thereby secure the flange to the printed circuit board and relieve stress on the connection points.

18. The electrical connector according to claim 13, wherein the plurality of connection points comprises a corresponding plurality of apertures located in the printed circuit board for accommodating the plurality of parallel conductors.

19. An electrical connector, comprising:
mechanical securing means for securing the electrical connector to a printed circuit board;
a receiving aperture having a plurality of electrical conductors positioned on an inner perimeter surface of the receiving aperture; and
a protrusion having the plurality of electrical conductors positioned on an outer perimeter surface thereof, the protrusion being sized to fit into a second receiving aperture of a second electrical connector connected to a second printed circuit board, the insertion of the protrusion into the second receiving aperture causing the plurality of electrical conductors to frictionally contact a second plurality of electrical conductors of the second electrical connector thereby establishing electrical connections between the plurality of electrical conductors and the second plurality of electrical conductors,
wherein the receiving aperture is sized to accommodate a third protrusion of a third electrical connector connected to a third printed circuit board, the insertion of the third protrusion into the receiving aperture causing the plurality of electrical conductors to frictionally contact a third plurality of electrical conductors of the third electrical connector thereby establishing electrical connections between the plurality of electrical conductors and the third plurality of electrical conductors.

20. The electrical connector according to claim 19, wherein insertion of the third protrusion into the receiving aperture generates alignment forces to help align the plurality of electrical connectors and the third plurality of electrical connectors.

21. An electrical connector for connecting to a printed circuit board, the electrical connector comprising:
an upper portion having an outer perimeter and a receiving aperture located therein, the receiving aperture having a first perimeter and a first plurality of electrical contacts located thereon;
a lower portion located opposite the upper portion and having a protruding portion thereon, the protruding portion having a second perimeter and a second plurality of electrical contacts located thereon;
electrical connecting means disposed along the outer perimeter for connecting the first plurality of electrical contacts to the printed circuit board; and
mechanical securing means for mechanically securing the electrical connector to the printed circuit board, the mechanical securing means attenuating structural forces between the electrical connecting means and the printed circuit board.

22. The electrical connector for connecting to a printed circuit board according to claim 21, wherein the mechanical securing means comprises a flange located between the upper portion and the lower portion.

23. The electrical connector for connecting to a printed circuit board according to claim 22, wherein the electrical connecting means comprises a plurality of electrical conductors, each of the plurality of electrical conductors spanning approximately one hundred eighty degrees from the first plurality of electrical contacts to the printed circuit board.

24. An electrical connector, comprising:
(a) a housing comprising:
(1) a lower portion having an outer side-wall surface and an underside surface;
(2) an upper portion having an outer side-wall surface and an inner side-wall surface, the inner side-wall surface being capable of receiving a lower portion of another similarly-shaped electrical conductor;
(b) a plurality of adjacent, flat electrical contacts located on both the outer side-wall surface of the lower portion and on the inner side-wall surface of the upper portion; and
(c) mechanical securing means for mechanically securing the electrical connector to a printed circuit board along the outer side-wall surface of one of the lower portion and the upper portion, the mechanical securing of the electrical connector allowing for visual inspection of the mechanical securing means after the electrical connector has been mechanically secured to the printed circuit board.

25. The electrical connector according to claim 24, wherein the mechanical securing means comprises a plurality of flexible electrical conductors, each of the plurality of flexible electrical conductors connecting a corresponding one of the plurality of adjacent, flat electrical contacts to a connection point on the printed circuit board, the plurality of the flexible electrical conductors allowing the electrical connector to float with respect to the printed circuit board to thereby attenuate stress on the connection points.

26. The electrical connector according to claim 24, wherein the plurality of adjacent, flat electrical contacts comprises a plurality of flexible electrical conductors, and wherein the upper portion is separate from the lower portion, the upper portion being connected to the lower portion by the plurality of flexible electrical conductors to thereby allow the upper portion to float with respect to the lower portion.

27. The electrical connector according to claim 24, wherein the electrical connector comprises a flange located on the outer side-wall surface of one of the lower portion and the upper portion, and wherein the mechanical securing means comprises an adhesive applied between the flange and a portion of the printed circuit board.

28. The electrical connector according to claim 24, wherein the plurality of adjacent, flat electrical contacts, located on the inner side-wall surface of the upper portion of the electrical connector, brushe against a plurality of adjacent, flat electrical contacts, located on an outer side-wall surface of a lower portion of another similarly-shaped electrical connector, when the lower portion of the other electrical connector is inserted into the upper portion of the electrical connector.

29. The electrical connector according to claim 24, wherein each of the plurality of adjacent flat electrical contacts has a slight taper.

30. The electrical connector according to claim 24, wherein the lower portion of the electrical connector has a slight taper to thereby generate an increasing amount of friction as the lower portion of the electrical connector is increasingly inserted further and further into an upper portion of another electrical connector.

31. An electrical connector for connecting to a printed circuit board, the electrical connector comprising:

an upper portion having a receiving aperture located therein, the receiving aperture having a first perimeter and a first plurality of electrical contacts located thereon;

a lower portion located opposite the upper portion and having a protruding portion thereon, the protruding portion having a second perimeter and a second plurality of electrical contacts located thereon;

electrical connecting means for electrically connecting the first plurality of electrical contacts to the printed circuit board;

mechanical securing means for mechanically securing the electrical connector to the printed circuit board, the mechanical securing means attenuating structural forces between the electrical connecting means and the printed circuit board; and wherein the electrical connecting means comprises a plurality of electrical conductors, each of the plurality of electrical conductors spanning approximately one hundred eighty degrees from the first plurality of electrical contacts to the printed circuit board.

32. The electrical connector for connecting to a printed circuit beard according to claim 31, wherein each of the plurality of electrical conductors runs from a first orientation, which is perpendicular to a plane defined by the printed circuit board, to a second orientation, which is parallel to the plane defined by the printed circuit board, and finally to a third orientation, which is also perpendicular to the plane defined by the printed circuit board.

33. An electrical connector, comprising:

(a) a housing comprising:

(1) a lower portion having an outer side-wall surface and an underside surface;

(2) an upper portion having an outer side-wall surface and an inner side-wall surface, the inner side-wall surface being capable of receiving a lower portion of another electrical conductor;

(b) a plurality of adjacent, flat electrical contacts located on both the outer side-wall surface of the lower portion and on the inner side-wall surface of the upper portion;

(c) mechanical securing means for mechanically securing the electrical connector to a printed circuit board along the outer side-wall surface of one of the lower portion and the upper portion, the mechanical securing of the electrical connector allowing for visual inspection of the mechanical securing means after the electrical connector has been mechanically secured to the printed circuit board; and wherein the mechanical securing means comprises a plurality of flexible electrical conductors, each of the plurality of flexible electrical conductors connecting a corresponding one of the plurality of adjacent, flat electrical contacts to a connection point on the printed circuit board, the plurality of the flexible electrical conductors allowing the electrical connector to float with respect to the printed circuit board to thereby attenuate stress on the connection points.

34. An electrical connector, comprising:

(a) a housing comprising:

(1) a lower portion having an outer side-wall surface and an underside surface;

(2) an upper portion having an outer side-wall surface and an inner side-wall surface, the inner side-wall surface being capable of receiving a lower portion of another electrical conductor;

(b) a plurality of adjacent, flat electrical contacts located on both the outer side-wall surface of the lower portion and on the inner side-wall surface of the upper portion;

(c) mechanical securing means for mechanically securing the electrical connector to a printed circuit board along the outer side-wall surface of one of the lower portion and the upper portion, the mechanical securing of the electrical connector allowing for visual inspection of the mechanical securing means after the electrical connector has been mechanically secured to the printed circuit board;

wherein the plurality of adjacent, flat electrical contacts comprises a plurality of flexible electrical conductors; and wherein the upper portion is separate from the lower portion, the upper portion being connected to the lower portion by the plurality of flexible electrical conductors to thereby allow the upper portion to float with respect to the lower portion.

35. The electrical connector according to claim 34, wherein the upper portion of the electrical connector is rigidly secured to the printed circuit board, and wherein the lower portion of the electrical connector can accommodate an upper portion of another electrical connector, which is rigidly secured to another printed circuit board, to thereby allow the printed circuit board to be electrically connected to the other printed circuit board in a floating mechanical fashion.

* * * * *